(12) United States Patent
Chen et al.

(10) Patent No.: US 7,473,623 B2
(45) Date of Patent: Jan. 6, 2009

(54) PROVIDING STRESS UNIFORMITY IN A SEMICONDUCTOR DEVICE

(75) Inventors: Jian Chen, Austin, TX (US); Mark W. Michael, Cedar Park, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 427 days.

(21) Appl. No.: 11/428,022

(22) Filed: Jun. 30, 2006

(65) Prior Publication Data
US 2008/0003789 A1 Jan. 3, 2008

(51) Int. Cl.
*H01L 21/3205* (2006.01)
*H01L 21/4763* (2006.01)

(52) U.S. Cl. ............ 438/585; 257/377; 257/E29.009; 257/E21.09

(58) Field of Classification Search ............ 438/586, 438/299, 635, 291, 197, 785; 257/499, 377, 257/E21.09, E29.009
See application file for complete search history.

(56) References Cited

U.S. PATENT DOCUMENTS

| | | | |
|---|---|---|---|
| 6,384,450 B1 | 5/2002 | Hidaka et al. | 257/321 |
| 6,579,784 B1 | 6/2003 | Huang | 438/595 |
| 2001/0054725 A1* | 12/2001 | Nagai et al. | 257/288 |
| 2002/0076867 A1 | 6/2002 | Lee et al. | 438/183 |
| 2003/0098473 A1 | 5/2003 | Matsuda et al. | 257/202 |
| 2004/0262694 A1 | 12/2004 | Chidambaram | 257/369 |
| 2005/0001267 A1 | 1/2005 | Miyagawa et al. | 257/332 |
| 2005/0048729 A1 | 3/2005 | Yoon et al. | 438/303 |
| 2005/0250326 A1* | 11/2005 | Matsuda | 438/682 |
| 2006/0226453 A1* | 10/2006 | Wang et al. | 257/288 |
| 2007/0026599 A1* | 2/2007 | Peidous et al. | 438/199 |
| 2007/0190741 A1* | 8/2007 | Lindsay | 438/424 |
| 2008/0003789 A1* | 1/2008 | Chen et al. | 438/585 |
| 2008/0203493 A1* | 8/2008 | Yasuda | 257/377 |

(Continued)

FOREIGN PATENT DOCUMENTS

DE 102004063139 12/2005

(Continued)

OTHER PUBLICATIONS

PCT Search Report Dated Aug. 2, 2007 for Serial No. PCT/US07/007842.

(Continued)

*Primary Examiner*—Walter L Lindsay, Jr.
(74) *Attorney, Agent, or Firm*—Williams, Morgan & Amerson, P.C.

(57) ABSTRACT

A method includes forming a plurality of functional features on a semiconductor layer in a first region. A non-functional feature corresponding to the functional feature is formed adjacent at least one of the functional features disposed on a periphery of the region. A stress-inducing layer is formed over at least a portion of the functional features and the non-functional feature. A device includes a semiconductor layer, a first dummy gate electrode, and a stress-inducing layer. The plurality of transistor gate electrodes is formed above the semiconductor layer. The plurality includes at least a first end gate electrode, a second end gate electrode, and at least one interior gate electrode. The first dummy gate electrode is disposed proximate the first end gate electrode. The stress-inducing layer is disposed over at least a portion of the plurality of transistor gate electrodes and the first dummy gate electrode.

31 Claims, 3 Drawing Sheets

U.S. PATENT DOCUMENTS

2008/0230844 A1* 9/2008 Yu et al. .................. 257/377
2008/0242069 A1* 10/2008 Zhu et al. ................. 438/585
2008/0246092 A1* 10/2008 Lee et al. ................. 257/377
2008/0254606 A1* 10/2008 Baek et al. ............... 438/585

OTHER PUBLICATIONS

Highly Dense High Performance 130NM Mode CMOS Technology for Large Scale System-on-a-Chip Applications, by Ootsuka, et al, 2000.

* cited by examiner

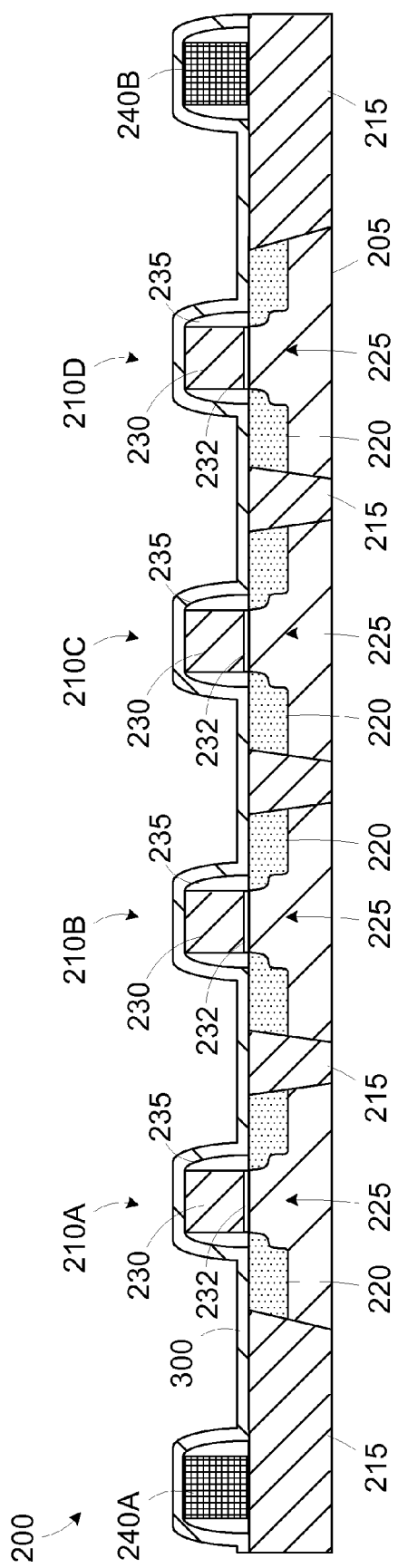
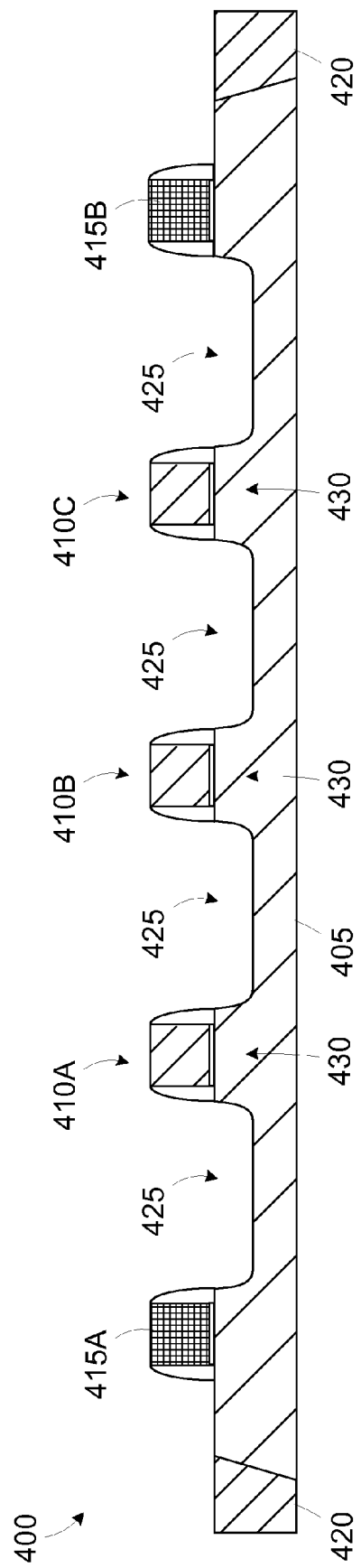
Figure 3
Figure 4

PROVIDING STRESS UNIFORMITY IN A SEMICONDUCTOR DEVICE

CROSS-REFERENCE TO RELATED APPLICATIONS

Not applicable.

STATEMENT REGARDING FEDERALLY SPONSORED RESEARCH OR DEVELOPMENT

Not Applicable

BACKGROUND OF THE INVENTION

The present invention relates generally to semiconductor manufacturing and, more particularly, to the use of a feature to provide stress uniformity.

Integrated circuits comprise a large number of individual circuit elements, such as transistors, capacitors and resistors and the like. These elements are connected internally to form complex circuits, such as memory devices, logic devices and microprocessors. The performance of integrated circuits can be improved by increasing the number of functional elements in the circuit to increase its functionality and/or by increasing the speed of operation of the circuit elements. A reduction of feature sizes allows the formation of a greater number of circuit elements on the same area, hence allowing an extension of the functionality of the circuit, and also reduces signal propagation delays, thus making an increase of the speed of operation of circuit elements possible.

Field effect transistors are commonly used as switching elements in integrated circuits. They allow control of a current flowing through a channel region located between a source region and a drain region. The source region and the drain region are highly doped. In N-type transistors, the source and drain regions are doped with an N-type dopant. Conversely, in P-type transistors, the source and drain regions are doped with a P-type dopant. The doping of the channel region is inverse to the doping of the source region and the drain region. The conductivity of the channel region is controlled by a gate voltage applied to a gate electrode formed above the channel region and separated therefrom by a thin insulating layer. Depending on the gate voltage, the channel region may be switched between a conductive "on" state and a substantially non-conductive "off" state.

When reducing the size of field effect transistors, it is important to maintain a high conductivity of the channel region in the "on" state. The conductivity of the channel region in the "on" state depends on the dopant concentration in the channel region, the mobility of the charge carriers, the extension of the channel region in the width direction of the transistor and the distance between the source region and the drain region, which is commonly denoted as "channel length." While a reduction of the width of the channel region leads to a decrease of the channel conductivity, a reduction of the channel length enhances the channel conductivity. An increase of the charge carrier mobility leads to an increase of the channel conductivity.

As feature sizes are reduced, the extension of the channel region in the width direction is also reduced. A reduction of the channel length raises a number of issues associated that need to be addressed. First, advanced techniques of photolithography and etching have to be provided to reliably and reproducibly create transistors having short channel lengths. Moreover, highly sophisticated dopant profiles, in the vertical direction as well as in the lateral direction, are required in the source/drain regions to provide a low sheet resistivity and a low contact resistivity in combination with a desired channel controllability. Furthermore, a reduction of the channel length may require a reduction in the depth of the source/drain region with respect to the interface formed by the gate insulation layer and the channel region. In some approaches, this may be achieved by forming raised source and drain regions formed with a specified offset to the gate electrode.

In view of the problems associated with a further reduction of the channel length, it has been proposed to also enhance the performance of field effect transistors by increasing the charge carrier mobility in the channel region. In principle, at least two approaches may be used to increase the charge carrier mobility.

First, the dopant concentration in the channel region may be reduced. Thus, the probability of scattering events of charge carriers in the channel region is reduced, which leads to an increase of the conductivity of the channel region. Reducing the dopant concentration in the channel region, however, significantly affects the threshold voltage of the transistor device. This makes the reduction of dopant concentration a less attractive approach.

Second, the lattice structure in the channel region may be modified by creating tensile or compressive stress. This leads to a modified mobility of electrons and holes, respectively. A tensile stress in the channel region increases the mobility of electrons. Depending on the magnitude of the tensile stress, an increase of the electron mobility of up to 20% or more can be achieved. In an N-type transistor, this leads to a corresponding increase of the conductivity of the channel region. Conversely, compressive stress in the channel region may increase the mobility of holes, thereby providing the potential for enhancing the performance of P-type transistors.

In a method of forming field effect transistors having stressed channel regions according to the state of the art, a layer comprising an alloy of silicon and germanium or an alloy of silicon and carbon, respectively, is introduced into the channel region to create a tensile or compressive stress. Alternatively, such a stress-creating layer may be provided below the channel region. In some instances, a portion of the substrate adjacent eth channel is removed and replaced with a stress-inducing silicon alloy. Subsequently, the source and drain regions are formed in the alloy material by further doping procedures.

A problem with the method of forming field effect transistors having stressed channel regions according to the state of the art is that the formation of the stress-creating layer requires a considerable modification of conventional and well-approved techniques used for the formation of field effect transistors. Another issue is that the physical layout of the semiconductor device affects the stress uniformity locally and across the wafer. Because the layout includes regions with differing pattern densities, the induced stresses are not uniform across an individual die. Highly dense active regions may be adjacent other regions with low pattern density. The stress characteristics differ with pattern density. Also, on a local scale, features on the periphery of a particular functional block do not exhibit the same geometry as features within the block. Hence, the local stress at these features also varies.

By way of example, consider the cross-section view of an exemplary semiconductor device 100 shown in FIG. 1. The device 100 includes a plurality of transistors 110A-D formed on an active region of a substrate 115 and separated by isolation structures 120 (e.g., shallow trench isolation structures). For ease of illustration, not all features of the transistors 110A-D are shown. In the illustration of FIG. 1, the transistors 110A-D are N-channel devices. A stress-inducing film 125 is formed over the transistors 110A-D to induce stress in the channel regions 135 to enhance performance. Note that the end transistors 110A, 110D have adjacent regions 140 that have a reduced pattern density. For example, the regions 140 may exist between different structures. Because of the change in pattern density, the stress induced on the channel regions 135 of the transistors 110A, 110D adjacent the regions 140 differs from the stress induced on the channel regions 135 of the center transistors 110B, 110C. The level of stress variation depends on various factors, such as the dimensions and materials with which the transistors 110A-D, substrate 115, and film 125 are fabricated. Stress variation across the collection of transistors can result in performance variation, which can, in turn, reduce the grade and profitability of the device 100.

This section of this document is intended to introduce various aspects of art that may be related to various aspects of the present invention described and/or claimed below. This section provides background information to facilitate a better understanding of the various aspects of the present invention. It should be understood that the statements in this section of this document are to be read in this light, and not as admissions of prior art. The present invention is directed to overcoming, or at least reducing the effects of, one or more of the problems set forth above.

BRIEF SUMMARY OF THE INVENTION

The following presents a simplified summary of the invention to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

One aspect of the present invention is seen in a method that includes forming a plurality of functional features on a semiconductor layer in a first region. A non-functional feature corresponding to the functional feature is formed adjacent at least one of the functional features disposed on a periphery of the region. A stress-inducing layer is formed over at least a portion of the functional features and the non-functional feature.

Another aspect of the present invention is seen a device including a semiconductor layer, a first dummy gate electrode, and a stress-inducing layer. The plurality of transistor gate electrodes is formed above the semiconductor layer. The plurality includes at least a first end gate electrode, a second end gate electrode, and at least one interior gate electrode. The first dummy gate electrode is disposed proximate the first end gate electrode. The stress-inducing layer is disposed over at least a portion of the plurality of transistor gate electrodes and the first dummy gate electrode.

BRIEF DESCRIPTION OF THE SEVERAL VIEWS OF THE DRAWINGS

The invention will hereafter be described with reference to the accompanying drawings, wherein like reference numerals denote like elements, and:

FIGS. 2 and 3 are cross section views of a semiconductor device in accordance with one illustrative embodiment of the present invention illustrating the use of non-functional structures adjacent functioning features to provide stress uniformity in conjunction with a stress-inducing layer; and FIGS. 4 and 5 are cross section views of a semiconductor device in accordance with another illustrative embodiment of the present invention illustrating the use of non-functional structures adjacent functioning features to provide stress uniformity in conjunction with a stress-inducing layer formed in recesses abutting a channel region of the functioning devices;

Figure 1:
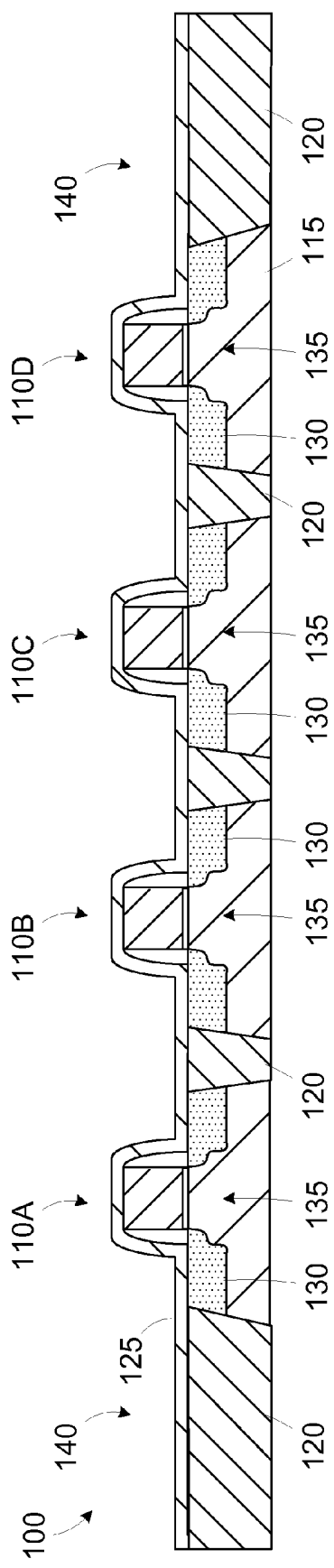
FIG. 1 is cross section view of a prior art semiconductor device including a stress-inducing layer.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

One or more specific embodiments of the present invention will be described below. It is specifically intended that the present invention not be limited to the embodiments and illustrations contained herein, but include modified forms of those embodiments including portions of the embodiments and combinations of elements of different embodiments as come within the scope of the following claims. It should be appreciated that in the development of any such actual implementation, as in any engineering or design project, numerous implementation-specific decisions must be made to achieve the developers' specific goals, such as compliance with system-related and business related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure. Nothing in this application is considered critical or essential to the present invention unless explicitly indicated as being "critical" or "essential."

The present invention will now be described with reference to the attached figures. Various structures and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present invention allows the formation of a semiconductor structure with increased stress uniformity. Non-functional features, also referred to as "dummy" features, are provided adjacent functional features to enhance stress uniformity amongst the functional features. The dummy features correspond to the functional features in that they have the same general shape and may be comprised of similar materials. In some embodiments, the dummy features may be formed using the same processes as the functional features, thereby having the same dimensions and materials. More particularly, in the case where the functional features are transistor gates, dummy gates are formed adjacent the end transistor gates in an active region so that the end gates effectively see approximately the same pattern density as the inner gates. Uniform pattern density contributes to uniform stresses applied to the functional devices.

Figure 2:
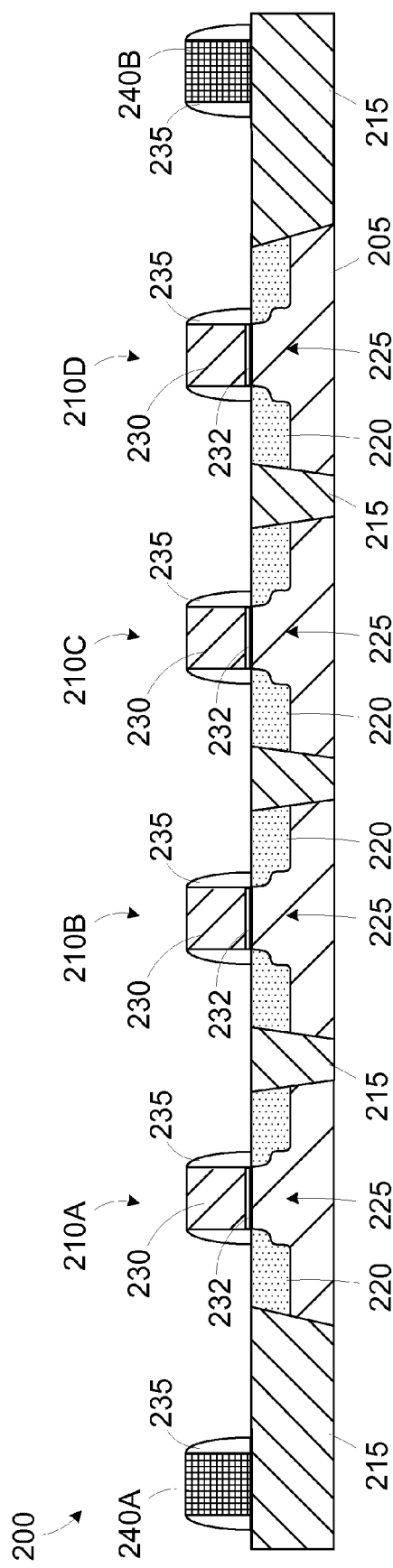

Referring now to the drawings wherein like reference numbers correspond to similar components throughout the several views, the present invention shall be described in the context of FIG. 2, which shows a schematic cross-sectional view of a semiconductor structure 200. The semiconductor structure 200 includes a semiconductor layer 205 (e.g., an active region of a substrate). The substrate transistor elements 210A-D are formed on the semiconductor layer 205, and shallow trench isolation or field isolation structures 215 electrically insulate the transistor elements 210A-D from each other and from other circuit elements in the semiconductor structure 200.

Source/drain regions 220 are in the semiconductor layer 205 thereby defining channel regions 225 for each transistor 210A-D. Over the channel region 225, a gate stack 230, including a gate insulation layer 232 and sidewall spacers 235 is formed. For ease of illustration and to avoid obscuring the present invention, not all features of the transistors 210A-D are illustrated. For example, the gate stacks 230 may include a conductive gate electrode above the gate insulation layer 232. Various conductive lines and vias (not shown) may be formed in one or more insulating layers (not shown) formed above the gate stacks 230. For example, the gate electrode may be comprised of polysilicon, and it may be covered by a silicide layer. The source/drain regions 220 may also include metal silicide regions. Various gate embodiments may be used, and their specific constructs are well known to those of ordinary skill in the art.

The transistor elements 110A-D represent a group or array of transistors. There may be more or less transistors than the number illustrated. Also the construct of the transistor elements 110A-D may vary, depending on the particular embodiment. For example, the transistor elements may be N-type or P-type. The profile of the source/drain regions 220 may vary. Some of the isolation structures 215 may be omitted. For example, a multiple finger device may be formed without interceding isolation structures 215.

As seen in FIG. 2, during the formation of the gate stacks 230, a dummy gate 240A-B is formed adjacent each of the outermost transistor elements 210A, 210D, respectively. In the illustrated embodiment, the dummy gates may be formed of the same materials as the transistor gate stacks 230 (e.g., polysilicon), but are not functional. Generally, the same materials are used for the dummy gates 240A-B and the transistor gate stacks 230 for ease of fabrication. However, it is contemplated that the dummy gates 240A-B may not be identical in all respects to the transistor gate stacks 230. The dummy gates 240A-B are illustrated with different cross-hatching than the transistor gate stacks 230 to denote that they are non-functional, not necessarily to indicate a difference in material. In the illustrated embodiment, the dummy gates 240A-B are formed over an isolation structure 215, however, in some cases they may be formed over the semiconductor layer 205, depending on the particular layout of the device 200.

In fabricating the device 200 of FIG. 2, the trench isolation structures 215, gate stacks 230, and dummy gates 240A-B are formed by means of advanced techniques of ion implantation, oxidation, deposition and photolithography. Subsequently, in some embodiments, dopant ions are implanted into the source/drain regions 220. Then, the sidewall spacers 235 may be formed adjacent the gate stacks 230 and dummy gates 240A-B, which may be done by means of conformally depositing a layer of a spacer material over the semiconductor layer 205 and performing an anisotropic etching process, as known to persons skilled in the art. The source/drain regions 220 are then completed by a further implantation of dopant ions. In this implantation, the sidewall spacers 235 protect portions of the source/drain regions 220 adjacent the gate stacks 230 from being irradiated with ions. Thus, the source/drain regions 220 include source/drain extensions which are shallower than the rest of the source/drain regions 220. Multiple spacers may be used or the spacers may be omitted entirely to tailor the profile of the source/drain regions 220.

Subsequently, metal silicide regions (not shown) may be formed by depositing a metal layer over the semiconductor layer 205 and annealing the semiconductor structure 200 to initiate a chemical reaction between the metal and the silicon in the source/drain regions 220 and the gate stacks 230.

Turning now to FIG. 3, a stress-inducing layer 300 is formed over the gate stacks 230 of the transistor elements 210A-D and the dummy gates 240A-B. The stress-inducing layer 300 has a predetermined intrinsic stress characteristic and may be formed by a variety of techniques, such as plasma enhanced chemical vapor deposition.

Plasma enhanced chemical vapor deposition is a technique for depositing a material on a deposition surface. The deposited material is formed as a result of a chemical reaction between gaseous reactants, which occurs on or in the vicinity of the deposition surface. Solid products of the reaction are deposited on the deposition surface. The chemical reaction occurs in a plasma, which may be created, for example, by means of a glow discharge. The glow discharge can be generated by applying a radio frequency alternating voltage between two electrodes, one of which is provided close to the semiconductor structure 200. In addition to the radio frequency alternating voltage, a direct voltage or a low frequency alternating voltage, which is denoted as "bias voltage," may be applied between the electrodes. In the glow discharge, molecules of the gaseous reactant are decomposed into a variety of species including radicals, ions, atoms and molecules in excited states. These species impinge on the deposition surface and are chemically bond to the deposition surface. Thus, a layer of material is deposited on the deposition surface.

The predetermined intrinsic stress characteristic of the stress-inducing layer 300 may be determined by the deposition conditions applied in the formation of the stress-inducing layer 300. In general, the predetermined stress characteristic depends on the gas mixture, the deposition rate, the temperature, the radio frequency alternating voltage, and the bias voltage. The amount of tensile or compressive stress in the layer 300 can be adjusted, for instance, by varying one or more of these parameters. In particular, the bias voltage may be varied to adjust an ion bombardment during the deposition process, thereby creating tensile or compressive stress in the stress-inducing layer 300. The stress-inducing layer 300 may be formed from a dielectric material, e.g., silicon nitride. A tensile stress in a silicon nitride stress-inducing layer 300 may be created by significantly reducing or turning off the bias voltage. On the other hand, a moderately high bias voltage may create compressive stress in the stress-inducing layer 300.

The provision of the dummy gates 240A-B adjacent the gate stacks 230 of the transistor elements 210A, 210D provides a more uniform pattern density for the transistor elements 210A-D. The end transistor elements 210A, 210D effectively see the same approximate structure as the inner transistor elements 210B, 210C with respect to the geometry of the stress-inducing layer 300. Hence, the stress induced by the stress layer 300 is more uniform. Reduced variation in the applied stress leads to performance improvement, and hence, increased profitability for the completed semiconductor device 200.

Following the formation of the stress-inducing layer 300 over the dummy gates 240A-B and transistor elements 210A-D, fabrication continues to complete the device 200. For example, in one embodiment, a dielectric layer (not shown) is formed over the transistor elements 210A-B and vias are formed in the dielectric layer to contact the source/drain regions 220 and gate stacks 230 and filled with a conductive material (e.g., copper). An exemplary description of a transistor device employing a stress-inducing layer construction is provided in U.S. patent application Ser. No. 11/114,262, filed on Apr. 26, 2005, entitled "METHOD OF Forming a Semiconductor Structure Comprising Transistor ELEMENTS WITH DIFFERENTLY STRESSED CHANNEL REGIONS," assigned to the assignee of the present application, and incorporated herein by reference in its entirety.

Figure 5:
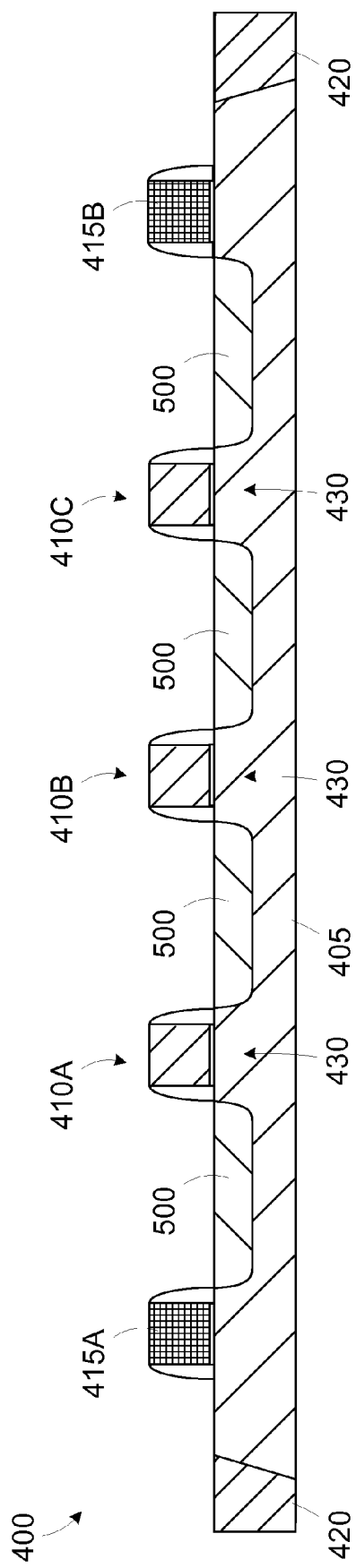

Turning now to FIGS. 4 and 5, another embodiment of the present invention is described with reference to a semiconductor device 400. Rather than using a conformal stress-inducing layer 300 as in the embodiment of FIG. 3, stress is applied to the channel by forming stress regions directly adjacent the channels. As seen in FIG. 4, a semiconductor layer 405 (e.g., an active region of a substrate) is provided, and transistor elements 410A-C and adjacent dummy gates 415A-B are formed thereon. Again, not all features of the transistor elements 410A-C are illustrated. The illustrative device shown in FIG. 4 is a three-finger field effect transistor. Accordingly, isolation structures 420 are provided bordering the device, but not between the transistor elements 410A-C. The application is not limited to the particular transistor structure shown in FIG. 4, as the number of transistor elements and the type of structure formed thereby may vary. For example, in some cases intervening isolation structures 420 may be used.

Recesses 425 are formed in the semiconductor layer 405 adjacent and extending between the channel regions 430 of the transistor elements 410A-C. The dummy gates 415A-B are formed at least partially over semiconductor layer 405 (i.e., the active portion of the substrate) adjacent the outside transistor elements 410A, 410C to allow the recesses 425 between the dummy gates 415A, 415B and their respective adjacent transistor elements 410A, 410C to have the same general dimensions as the recesses 425 disposed between the transistor elements 410A-C. The recesses 425 may be formed using various fabrication processes. For example, the surface of the semiconductor layer 405 may be oxidized and the oxide may be stripped using appropriate wet or dry etch technology to leave the recesses 425. Alternatively, an anisotropic etch may be used to remove a portion of the semiconductor layer 405 to create the recesses 425.

Referring now to FIG. 5, the recesses are filled with an epitaxially grown material 500 that, in one illustrative embodiment, completely fills the recess 425. Although the epitaxially grown material 500 is illustrated as being flush with the surface of the semiconductor layer 405, it is contemplated that in some embodiments, the epitaxially grown material 500 may extend above or below the surface of the semiconductor layer 405.

In one embodiment, the epitaxially grown material 500 includes one or more components that, upon deposition on the exposed surface of the semiconductor layer 405, form a crystalline structure that is similar to that of the semiconductor layer 405. In one particular embodiment, the semiconductor layer 405 is silicon and the epitaxially grown material 500 is silicon and at least one additional component, such as germanium, carbon and the like, provided in an appropriate ratio so that the epitaxially grown material 500 forms a crystalline structure similar to the underlying semiconductor layer 405, wherein the slight mismatch in the lattice structure, for instance caused by a different lattice spacing, leads to a strained region which exerts stress to adjacent material regions, such as the channel regions 430.

For instance, the epitaxially grown material 500 may be silicon and germanium in a mixture ratio of approximately 5-60 atomic percent germanium so that the corresponding epitaxially grown material 500 exhibits an increased lattice spacing compared to a pure silicon structure as is provided in the semiconductor layer 405. As a consequence, the expansion of the silicon germanium material 500 creates a compressive stress within the channel region 430. In other embodiments, a silicon carbon mixture, that is a silicon carbide material, may be provided in the epitaxially grown material 500, which forms a lattice having a reduced lattice spacing compared to the silicon structure. Consequently, the silicon carbon material 500 will tend to expand the channel region 430 and therefore will create tensile stress in the channel region 430. By creating compressive or tensile stress in the channel region 430, the mobility and thus the conductivity of these regions may be enhanced.

The amount of tensile or compressive stress in the channel region 430 may be controlled for a given device geometry by selecting an appropriate epitaxially grown material 500 and/or by selecting the depth of the recesses 425. For example, the ratio of compressive or tensile stress creating components in the epitaxially grown material 500 may be dictated by the process parameters of the epitaxial growth process, wherein a thickness of the epitaxially grown material 500 may significantly influence the magnitude of the mixture ratio so that it may be advantageous in some cases to reduce a thickness of the epitaxially grown material 500 to a relatively low value while using a moderately high mixture ratio, for instance, for silicon and germanium, of up to 60 atomic percent germanium. In this manner, the stress in the channel region 430 may finally be controlled by the depth.

In one embodiment, the epitaxially grown material 500 may include two or more distinct layers, such as a silicon germanium layer, followed by a silicon layer, or a plurality of alternating layers having different lattice spacings may be provided in the epitaxially grown material 500. In one particular embodiment, the epitaxially grown material 500 comprises a silicon layer as the very last layer to provide a high degree of compatibility with conventional process flows, for instance, if metal silicide regions are to be formed in the epitaxially grown material 500.

The formation of the epitaxially grown material 500 is accomplished by well-established epitaxial growth processes when commonly known material compositions, such as silicon germanium on silicon or silicon carbon on silicon and the like are used. If the semiconductor layer 405 includes other semiconductor layers, corresponding growth recipes may be established on the basis of opto-electronic manufacturing processes and/or on the basis of experiments to determine appropriate mixture ratios for creating tensile or compressive stress.

In other embodiments, the epitaxially grown material 500 may comprise, in addition or alternatively to a stress creating component, a dopant species in a specified concentration that enables the formation of a specified dopant profile, possibly in addition to further implantation cycles that are to be performed in a later manufacturing stage. For instance, a high dopant concentration may be introduced into the semiconductor layer 405 without damaging the crystalline structure, contrary to the case of an ion implantation sequence, thereby significantly relaxing the constraints with respect to the thermal budget in subsequent anneal cycles required for recrystallizing damaged crystalline semiconductor regions. The "deposition" of the dopant concentration may be controlled by adjusting the depth and by adjusting the epitaxial growth parameters in which, for instance, the addition of the dopant species may be varied over time so as to establish a desired vertical dopant profile in the epitaxially grown material 500. For example, if it is appropriate to locate high dopant concentration at a moderate depth, highly doped epitaxially grown material 500 may be deposited to fill the recesses 425. In other embodiments, a pure semiconductor material, except for the high dopant concentration, may first be deposited, followed by a stress-creating component.

As with the embodiment of FIG. 3, the dummy gates 415A-B create a more uniform topology for subsequent formation of the stress-inducing layer (e.g., the material 500). The end transistor elements 410A, 410C effectively see the same approximate structure as the inner transistor element 410B with respect to the geometry of the stress-inducing material 500. Hence, the stress induced is more uniform. Reduced variation leads to performance improvement, and hence, increased profitability for the completed semiconductor device 400.

Following the formation of the epitaxially grown material 500 adjacent the dummy gates 415A-B and transistor elements 410A-C, fabrication continues to complete the device 400. For example, source/drain regions may be completed, a dielectric layer may be formed over the transistor elements 410A-D and vias may be formed in the dielectric layer filled with a conductive material (e.g., copper). An exemplary description of a transistor device employing a recessed stress layer construction is provided in U.S. patent application Ser. No. 10/974,232, filed on Oct. 27, 2004, entitled "AN ADVANCED TECHNIQUE FOR FORMING A TRANSISTOR HAVING RAISED DRAIN AND SOURCE REGIONS," assigned to the assignee of the present application, and incorporated herein by reference in its entirety.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

We claim:

1. A method, comprising:
    forming a plurality of functional features on a semiconductor layer in a first region;
    forming a non-functional feature corresponding to the functional feature adjacent at least one of the functional features disposed on a periphery of the region;
    forming a stress-inducing layer proximate at least a portion of the functional features and the non-functional feature.

2. The method of claim 1, wherein forming the stress-inducing layer further comprising forming the stress-inducing layer to exert at least one of a tensile stress and a compressive stress on the functional features.

3. The method of claim 1, wherein the functional features comprise transistor gate electrodes.

4. The method of claim 3, wherein the non-functional feature comprises a dummy gate electrode.

5. The method of claim 4, wherein the transistor gate electrode and dummy gate electrode are formed of the same material.

6. The method of claim 1, further comprising forming the non-functional feature above the semiconductor layer.

7. The method of claim 1, further comprising:
    forming an isolation structure in the semiconductor layer adjacent the first region; and
    forming the non-functional feature above the isolation structure.

8. The method of claim 1, wherein forming the stress-inducing layer further comprises forming a conformal stress-inducing layer over the functional features and the non-functional feature.

9. The method of claim 8, wherein the conformal stress-inducing layer comprises a dielectric layer.

10. The method of claim 1, wherein forming the stress-inducing layer further comprises:
    removing a portion of the semiconductor layer proximate each of the functional features and the non-functional feature to define a plurality of recesses; and
    forming the stress-inducing layer to fill at least a portion of the recesses.

11. The method of claim 10, wherein forming the stress-inducing layer further comprises epitaxially growing the stress-inducing layer.

12. The method of claim 11, wherein the epitaxially grown stress-inducing layer comprises at least one component forming a crystal lattice having a lattice constant that differs from that of the semiconductor layer.

13. The method of claim 11, wherein the semiconductor layer comprises a silicon layer, and the epitaxially grown stress-inducing layer comprises silicon and at least one of germanium and carbon.

14. A method, comprising:
    forming a plurality of transistor gate electrodes above a semiconductor layer, the plurality including at least a first end gate electrode, a second end gate electrode, and at least one interior gate electrode;
    forming a first dummy gate electrode proximate the first end gate electrode; and
    forming a stress-inducing layer proximate at least a portion of the plurality of transistor gate electrodes and the first and second dummy gate electrodes.

15. The method of claim 14, further comprising forming a second dummy gate electrode proximate the second end gate electrode, wherein forming the stress-inducing layer further comprises forming the stress-inducing layer over at least a portion of the second dummy gate electrode.

16. The method of claim 14, wherein the plurality of transistor gate electrodes has an associated pattern density, and forming the first and second dummy gate electrodes comprises spacing the first dummy gate electrodes from the first end gate electrode to maintain the pattern density.

17. The method of claim 14, wherein forming the stress-inducing layer further comprising forming the stress-inducing layer to exert at least one of a compressive stress and a tensile stress on channel regions defined below each of the plurality of transistor gate electrodes.

18. The method of claim 14, wherein the plurality of transistor gate electrodes and the first dummy gate electrode are formed of the same material.

19. The method of claim 14, further comprising forming the first dummy gate electrode above the semiconductor layer.

20. The method of claim 14, further comprising:
forming at least one isolation structure in the semiconductor layer adjacent the first end gate electrode; and
forming the first dummy gate electrode above the isolation structure.

21. The method of claim 14, wherein forming the stress-inducing layer further comprises forming a conformal stress-inducing layer over the plurality of transistor gate electrodes and the first dummy gate electrode.

22. The method of claim 21, wherein the conformal stress-inducing layer comprises a dielectric layer.

23. The method of claim 14, wherein forming the stress-inducing layer further comprises:
removing a portion of the semiconductor layer proximate each of the transistor gate electrodes and the first dummy gate electrode to define a plurality of recesses; and
forming the stress-inducing layer to fill at least a portion of the recesses.

24. The method of claim 23, wherein forming the stress-inducing layer further comprises epitaxially growing the stress-inducing layer.

25. The method of claim 24, wherein the epitaxially grown stress-inducing layer comprises at least one component forming a crystal lattice having a lattice constant that differs from that of the semiconductor layer.

26. The method of claim 24, wherein the semiconductor layer comprises a silicon layer, and the epitaxially grown stress-inducing layer comprises silicon and at least one of germanium and carbon.

27. A device, comprising:

a semiconductor layer;

a plurality of transistor gate electrodes formed above the semiconductor layer, the plurality including at least a first end gate electrode, a second end gate electrode, and at least one interior gate electrode;

a first dummy gate electrode disposed proximate the first end gate electrode; and a stress-inducing layer disposed proximate at least a portion of the plurality of transistor gate electrodes and the first dummy gate electrode.

28. The device of claim 27, further comprising a second dummy gate electrode disposed proximate the second end gate electrode, wherein the stress-inducing layer is disposed over at least a portion of the second dummy gate electrode.

29. The device of claim 27, wherein the stress-inducing layer comprises a conformal layer.

30. The device of claim 27, wherein the stress-inducing layer is disposed in a plurality of recesses defined in the semiconductor layer adjacent the transistor gate electrodes and the first dummy gate electrode.

31. The device of claim 27, wherein the stress-inducing layer exerts at least one of a compressive stress and a tensile stress on channel regions defined below each of the plurality of transistor gate electrodes.

* * * * *